(12) United States Patent
Hada et al.

(10) Patent No.: US 8,507,950 B2
(45) Date of Patent: Aug. 13, 2013

(54) METHOD OF PRODUCING SEMICONDUCTOR WAFER AND SEMICONDUCTOR WAFER

(75) Inventors: Junya Hada, Ichikawa (JP); Tsuyoshi Nakano, Sodegaura (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 72 days.

(21) Appl. No.: 13/191,173

(22) Filed: Jul. 26, 2011

(65) Prior Publication Data
US 2011/0281423 A1 Nov. 17, 2011

Related U.S. Application Data

(63) Continuation-in-part of application No. PCT/JP2010/000429, filed on Jan. 26, 2010.

(30) Foreign Application Priority Data

Jan. 28, 2009 (JP) ................. 2009-016928

(51) Int. Cl.
*H01L 29/66* (2006.01)
*H01L 29/20* (2006.01)
*H01L 21/36* (2006.01)
*C30B 23/00* (2006.01)
*C30B 25/00* (2006.01)
*C30B 28/12* (2006.01)

(52) U.S. Cl.
USPC ........... 257/194; 257/615; 438/478; 438/481; 438/503; 117/89; 117/93

(58) Field of Classification Search
USPC ......... 438/478–509; 257/290–294, 192–195, 257/613–616; 117/84–109
See application file for complete search history.

(56) References Cited

U.S. PATENT DOCUMENTS

| 2006/0054923 A1 | 3/2006 | Nakano et al. |
| 2006/0192228 A1 | 8/2006 | Nakano et al. |
| 2007/0029640 A1 | 2/2007 | Isono et al. |

FOREIGN PATENT DOCUMENTS

| JP | 02-230746 | * | 9/1990 |
| JP | 07-111340 | * | 6/1995 |
| JP | 11-345812 A | | 12/1999 |

(Continued)

OTHER PUBLICATIONS

International Preliminary Report on Patentability for corresponding International Patent Application No. PCT/JP2010/000429 mailed Aug. 18, 2011.

(Continued)

*Primary Examiner* — Fernando L Toledo
*Assistant Examiner* — Karen Kusumakar
(74) *Attorney, Agent, or Firm* — Sughrue Mion, PLLC

(57) ABSTRACT

A method of producing a semiconductor wafer includes placing a base wafer within a reaction chamber, and epitaxially growing a p-type Group 3-5 compound semiconductor on the base wafer by supplying, into the reaction chamber, a Group 3 source gas consisting of an organometallic compound of a Group 3 element, a Group 5 source gas consisting of a compound of a Group 5 element, and an impurity gas including an impurity that is to be incorporated as a dopant into a semiconductor to serve as a donor. Here, during the epitaxial growth of the p-type Group 3-5 compound semiconductor, the flow rate of the impurity gas and the flow rate ratio of the Group 5 source gas to the Group 3 source gas are set so that the product N×d ($cm^{-2}$) of the residual carrier concentration N ($cm^{-3}$) and the thickness d (cm) of the p-type Group 3-5 compound semiconductor may be $8.0 \times 10^{11}$ or less.

12 Claims, 10 Drawing Sheets

(56) References Cited

FOREIGN PATENT DOCUMENTS

| | | | |
|---|---|---|---|
| JP | 2004-207472 A | | 7/2004 |
| JP | 2004-265925 A | | 9/2004 |
| JP | 2006-012915 | * | 1/2006 |
| JP | 2006-012915 A | | 1/2006 |
| JP | 2007-067359 A | | 3/2007 |

OTHER PUBLICATIONS

First Office Action issued Jan. 5, 2013 in Chinese Patent Application No. 201080005574.8 to Sumitomo Chemical Co., Ltd., with translation.

* cited by examiner

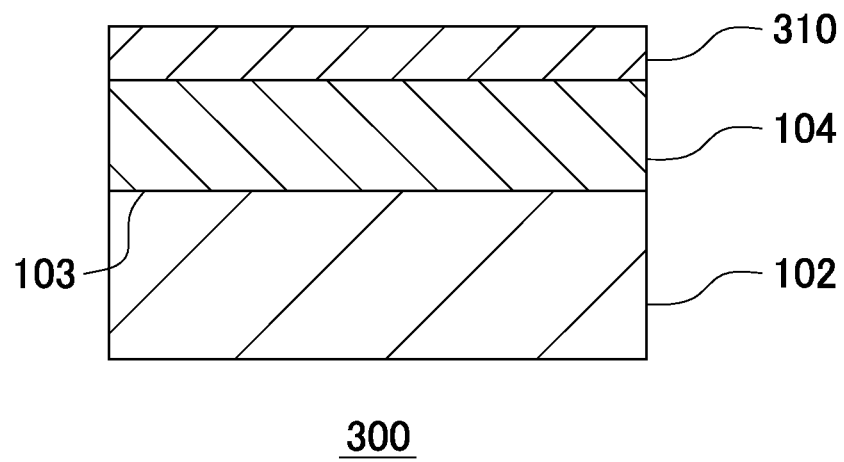
F I G . 3

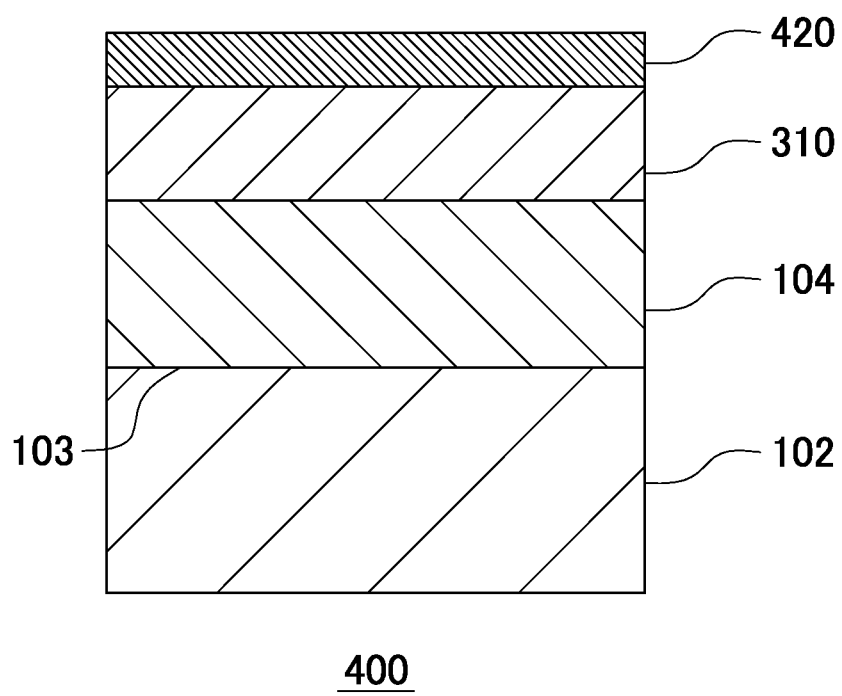
F I G . 4

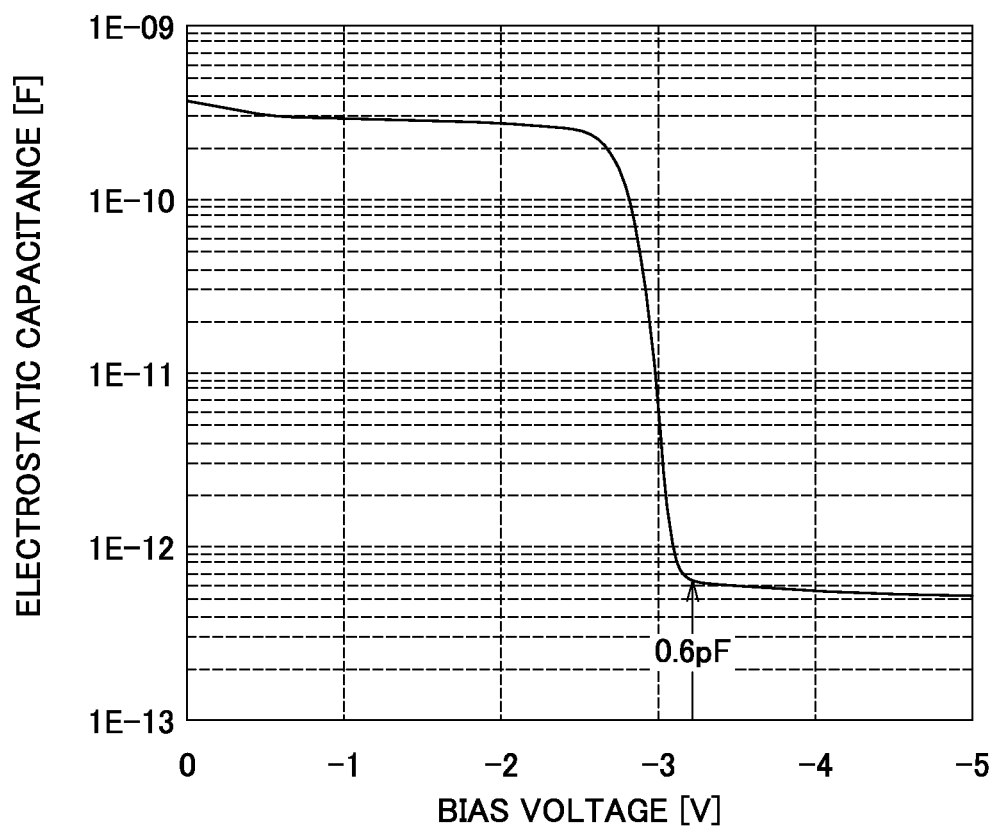
F I G . 7

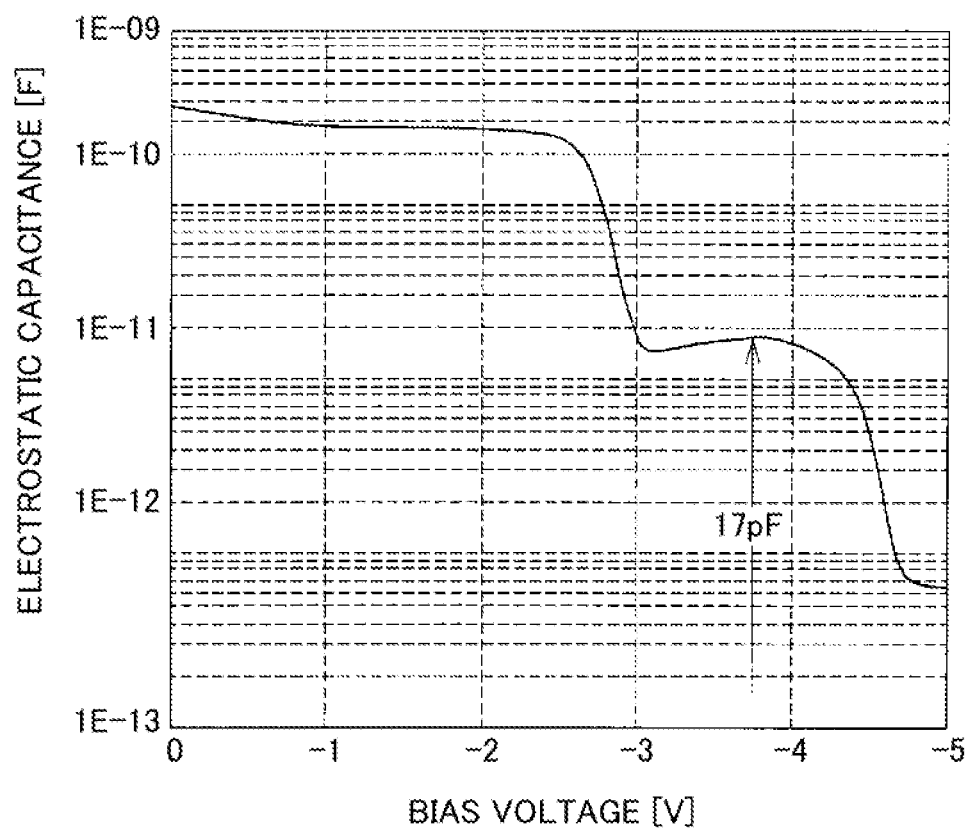
F I G . 9

METHOD OF PRODUCING SEMICONDUCTOR WAFER AND SEMICONDUCTOR WAFER

The contents of the following international patent application are incorporated herein by reference:
PCT/JP2010/00429 filed on Jan. 26, 2010.
The contents of the following Japanese Patent Application are incorporated herein by reference:
No. 2009-016928 filed on Jan. 28, 2009.

BACKGROUND

1. Technical Field

The present invention relates to a method of producing a semiconductor wafer and a semiconductor wafer.

2. Description of the Related Art

In recent years, Group 3-5 compound semiconductors such as GaAs, AlGaAs, and InGaAs have been used to produce electronic elements such as a field effect transistor (FET), a high electron mobility transistor (HEMT), and heterojunction bipolar transistor (HBT). To produce such electronic elements, a compound semiconductor epitaxial wafer is used. The compound semiconductor epitaxial wafer is produced by growing a crystal of a Group 3-5 compound semiconductor on a semi-insulative wafer such as a GaAs wafer by an epitaxial growth method. The epitaxial growth method includes liquid-phase epitaxy, molecular beam epitaxy, and metal organic chemical vapor deposition (MOCVD).

Japanese Patent Application Publication No. 11-345812 discloses a compound semiconductor epitaxial wafer including an AlGaAs buffer layer between a semi-insulative GaAs wafer and an n-type GaAs active layer. The buffer layer suppresses a leakage current, which degrades the characteristics of a FET. The buffer layer also suppresses the influence of the wafer or the impurities on the wafer on the characteristics of the FET. The buffer layer disclosed in Japanese Patent Application Publication No. 11-345812 is formed by metal organic vapor phase epitaxy (MOVPE), and donor impurities and acceptor impurities whose concentrations are close to each other are added to the buffer layer.

Japanese Patent Application Publication No. 2007-067359 discloses a Group 3-5 compound semiconductor device including a p-type buffer layer that is formed by MOVPE. Japanese Patent Application Publication No. 2007-067359 takes note of the relation between the thickness of the p-type buffer layer and the p-type carrier concentration of the p-type buffer layer, and proposes that the leakage current of the Group 3-5 compound semiconductor device be reduced by setting the product of the thickness and the p-type carrier concentration to range from $1 \times 10^{10}$ to $1 \times 10^{12}$ (cm$^{-2}$).

Although Japanese Patent Application Publication No. 11-345812 does not disclose the crystal growth conditions of the buffer layer, a normal method of forming a Group 3-5 compound semiconductor by MOVPE or MOCVD involves supplying the Group 5 sources such as P and As significantly more than the Group 3 sources such as Al, Ga, and In. This resultantly increases the cost of producing the compound semiconductor epitaxial wafer. Japanese Patent Application Publication No. 2007-067359 discloses that the p-type carrier concentration of the p-type buffer layer, which is doped with oxygen or a transition metal, is controlled. Japanese Patent Application Publication No. 2007-067359, however, does not consider how many amount of the Group 5 sources are supplied.

To cut the production cost, it is preferable to reduce the amount of the Group 5 sources to be supplied. If a reduced amount of the Group 5 sources is simply supplied in order to cut the production cost, however, the p-type carrier concentration of the Group 3-5 compound semiconductor becomes excessively high. Consequently, excess acceptor impurities cannot be ionized and thus remain. Accordingly, the Group 3-5 compound semiconductor cannot behave sufficiently as a buffer layer.

Specifically speaking, when MOVPE or MOCVD is employed, organometallic compounds such as trimethylgallium and trimethylaluminum are supplied as the Group 3 sources. The carbon in the organometallic compounds is incorporated into the crystal of the compound semiconductor during the crystal growth. The carbon concentration of the Group 3-5 compound semiconductor increases as the ratio of the Group 5 sources to the Group 3 sources, during the crystal growth, decreases. Since the carbon behaves as the acceptor impurities in the crystal of the Group 3-5 compound semiconductor, the p-type carrier concentration of the Group 3-5 compound semiconductor increases as the carbon concentration increases. Consequently, the Group 3-5 compound semiconductor cannot behave sufficiently as a buffer layer.

More specifically, if the p-type carriers remain in the Group 3-5 compound semiconductor, the residual capacitance of the Group 3-5 compound semiconductor increases, which resultantly increases the leakage current of the Group 3-5 compound semiconductor. This lowers the withstand voltage of the Group 3-5 compound semiconductor. This also degrades the carrier mobility in a semiconductor device such as a FET to be formed in the Group 3-5 compound semiconductor.

To prevent the excess acceptor impurities that cannot be ionized from remaining in the Group 3-5 compound semiconductor so that the Group 3-5 compound semiconductor can behave sufficiently as a buffer layer, it is preferable to maintain the p-type carrier concentration of the Group 3-5 compound semiconductor at an appropriate level while reducing the amount of the Group 5 sources to be supplied. Therefore, it is an object of the present invention to provide a method of producing a Group 3-5 compound semiconductor, according to which the use of the Group 5 sources can be reduced without degrading the properties of the Group 3-5 compound semiconductor.

SUMMARY

For a solution to the above-mentioned problems, according to the first aspect related to the present invention, provided is one exemplary method of producing a semiconductor wafer, including placing a base wafer within a reaction chamber, and epitaxially growing a p-type Group 3-5 compound semiconductor on the base wafer by supplying, into the reaction chamber, a Group 3 source gas consisting of an organometallic compound of a Group 3 element, a Group 5 source gas consisting of a compound of a Group 5 element, and an impurity gas including an impurity that is to be incorporated as a dopant into a semiconductor to serve as a donor. Here, during the epitaxial growth of the p-type Group 3-5 compound semiconductor, the flow rate of the impurity gas and the flow rate ratio of the Group 5 source gas to the Group 3 source gas are set so that the product N×d (cm$^{-2}$) of the residual carrier concentration N (cm$^{-3}$) and the thickness d (cm) of the p-type Group 3-5 compound semiconductor may be $8.0 \times 10^{11}$ or less. Here, the term "p-type Group 3-5 compound semiconductor" refers to a Group 3-5 compound semiconductor in which the p-type carrier concentration is higher than the n-type carrier concentration.

During the epitaxial growth of the p-type Group 3-5 compound semiconductor, the flow rate of the impurity gas and the flow rate ratio of the Group 5 source gas to the Group 3 source gas can be set so that the residual capacitance per unit area determined by capacitance-voltage measurement using a Schottky electrode in contact with an active layer disposed on the p-type Group 3-5 compound semiconductor may become less than 0.5 nF/cm².

During the epitaxial growth of the p-type Group 3-5 compound semiconductor, the flow rate ratio of the Group 5 source gas to the Group 3 source gas is preferably set to 50 or less. Furthermore, during the epitaxial growth of the p-type Group 3-5 compound semiconductor on the base wafer, the ratio of the difference in flow rate between the Group 5 source gas and the Group 3 source gas to the flow rate of the impurity gas is preferably set to $9.0 \times 10^6$ or less. According to a method of producing the above-described compound semiconductor epitaxial wafer, the impurity can include at least one element selected from the group consisting of Si, Se, Ge, Sn, S and Te. According to a method of producing the above-described compound semiconductor epitaxial wafer, the p-type Group 3-5 compound semiconductor and an active layer can be stacked on the base wafer in the stated order.

According to the second aspect related to the present invention, a semiconductor wafer includes a base wafer, and a p-type Group 3-5 compound semiconductor epitaxially grown on the base wafer by supplying a Group 3 source gas consisting of an organometallic compound of a Group 3 element, a Group 5 source gas consisting of a compound of a Group 5 element, and an impurity gas including an impurity that is to be incorporated as a dopant into a semiconductor to serve as a donor. Here, the p-type Group 3-5 compound semiconductor has a product of N×d (cm⁻²) of its residual carrier concentration N (cm⁻³) and its thickness d (cm) of $8.0 \times 10^{11}$ or less.

In the above-described semiconductor wafer, the residual capacitance per unit area is preferably less than 0.5 nF/cm² in capacitance-voltage measurement using a Schottky electrode in contact with an active layer disposed on the p-type Group 3-5 compound semiconductor. In the above-described semiconductor wafer, the p-type Group 3-5 compound semiconductor has been preferably epitaxially grown under such a condition that the ratio of the difference in flow rate between the Group 5 source gas and the Group 3 source gas to the flow rate of the impurity gas is $9.0 \times 10^6$ or less.

In the above-described semiconductor wafer, the p-type Group 3-5 compound semiconductor has been preferably epitaxially grown under such a condition that the flow rate ratio of the Group 5 source gas to the Group 3 source gas becomes 50 or less. The above-described semiconductor wafer can include at least one element selected from the group consisting of Si, Se, Ge, Sn, S and Te as a donor impurity. In the above-described semiconductor wafer, the p-type Group 3-5 compound semiconductor and an active layer can be stacked on the base wafer in the stated order.

BRIEF DESCRIPTION OF THE DRAWINGS

FIG. 3 schematically illustrates an exemplary cross-section of a semiconductor device 300.

FIG. 4 schematically illustrates an exemplary cross-section of a compound semiconductor epitaxial wafer 400.

FIG. 7 shows results of capacitance-voltage measurement performed on a compound semiconductor epitaxial wafer of Implementation Example 1.

FIG. 9 shows results of capacitance-voltage measurement performed on a compound semiconductor epitaxial wafer of Comparative Example 2.

DESCRIPTION OF EXEMPLARY EMBODIMENTS

Figure 1:
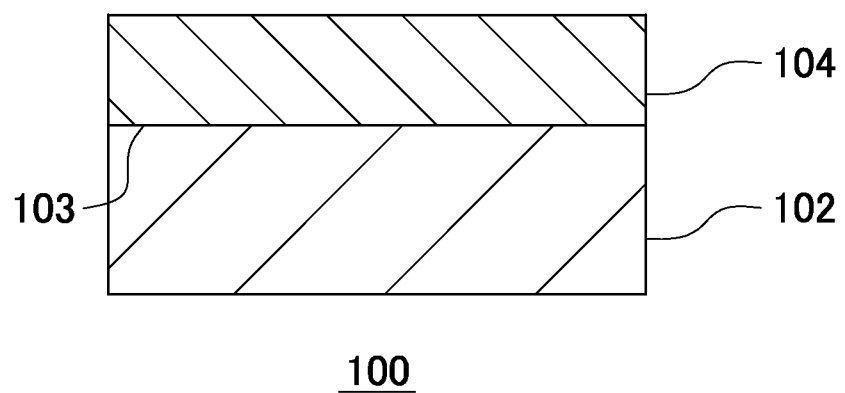
FIG. 1 schematically illustrates an exemplary cross-section of a compound semiconductor epitaxial wafer 100.

Some aspects of the invention will now be described based on the embodiments, which do not intend to limit the scope of the present invention, but exemplify the invention. The embodiments of the present invention will be hereinafter described with reference to the appended drawings, in which identical or similar components may be designated by identical reference numerals and not be repeatedly described. It should be noted that the drawings are only schematic, and the relation or ratio between the thickness and the planar dimension and other dimensional features shown in the drawings may not reflect the actual scale. For the purposes of the description, the relation or ratio between the respective dimensions may be partly on different scales among the drawings.

FIG. 1 schematically illustrates an exemplary cross-section of a compound semiconductor epitaxial wafer 100 relating to an embodiment. As shown in FIG. 1, the compound semiconductor epitaxial wafer 100 includes a base wafer 102 and a Group 3-5 compound semiconductor 104. The compound semiconductor epitaxial wafer 100 is an exemplary semiconductor wafer. The base wafer 102 includes, for example, a Group 3-5 compound semiconductor such as GaAs or a Group 4 semiconductor represented by $Si_xGe_{1-x}$ ($0 \leq x \leq 1$).

The Group 3-5 compound semiconductor 104 is a p-type Group 3-5 compound semiconductor. The Group 3-5 compound semiconductor 104 is formed, for example, by MOCVD. The Group 3-5 compound semiconductor 104 has a thickness of no less than 10 nm and no more than 3000 nm, for example. The Group 3-5 compound semiconductor 104 may have a plurality of layers.

The Group 3-5 compound semiconductor 104 is obtained by supplying a Group 3 source gas consisting of an organometallic compound of a Group 3 element, a Group 5 source gas consisting of a compound of Group 5 element, and an impurity gas including impurities that are to serve as donors to a main plane 103 of the base wafer 102 to grow a Group 3-5 compound semiconductor on the main plane 103. The impurities behave as donors when incorporated into the Group 3-5 compound semiconductor for doping and thus increase the n-type carrier concentration of the Group 3-5 compound semiconductor 104.

As the ratio of the Group 5 source to the Group 3 source during the crystal growth decreases, the carbon concentration of the Group 3-5 compound semiconductor increases, which increases the p-type carrier concentration within the Group 3-5 compound semiconductor 104. However, if the impurities that behave as donors increase the n-type carrier concentration of the Group 3-5 compound semiconductor 104, the increased n-type carriers compensate for the p-type carriers.

This reduces the residual p-type carrier concentration in the Group 3-5 compound semiconductor 104. Therefore, the Group 3-5 compound semiconductor 104 can behave sufficiently as a buffer layer.

Specifically speaking, as the p-type carries of the Group 3-5 compound semiconductor 104 decrease, the residual capacitance of the Group 3-5 compound semiconductor 104 decreases, which reduces the leakage current of the Group 3-5 compound semiconductor 104. This resultantly improves the withstand voltage of the Group 3-5 compound semiconductor 104. This also increases the carrier mobility in a semiconductor device such as FET to be formed in the Group 3-5 compound semiconductor 104. In other words, if the residual p-type carrier concentration of the Group 3-5 compound semiconductor 104 is lowered, the Group 3-5 compound semiconductor 104 achieves a high withstand voltage and serves as a buffer layer that is suitable for forming a semiconductor device with high electron mobility.

Here, the term "residual p-type carrier concentration" refers to the carrier concentration of the Group 3-5 compound semiconductor 104 when the p-type carrier concentration is higher than the n-type carrier concentration. Likewise, the term "residual n-type carrier concentration" refers to the carrier concentration of the Group 3-5 compound semiconductor 104 when the p-type carrier concentration is lower than the n-type carrier concentration. As described above, the amount of the Group 5 source used for producing the Group 3-5 compound semiconductor 104 can be reduced by supplying the impurity gas including impurities that are to behave as donors along with the Group 3 source gas and the Group 5 source gas.

Figure 2:
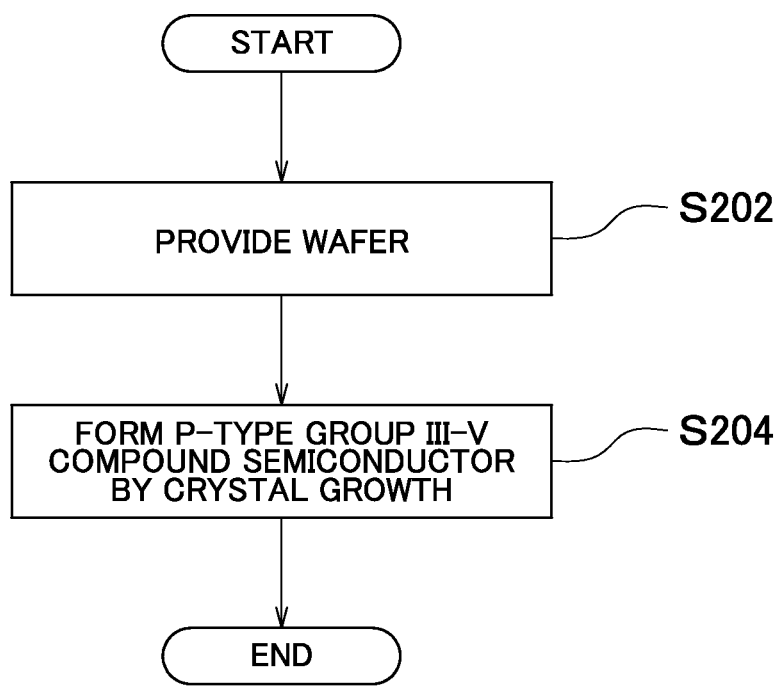
FIG. 2 schematically illustrates an exemplary method of producing the compound semiconductor epitaxial wafer 100.

FIG. 2 schematically illustrates an exemplary method of producing the compound semiconductor epitaxial wafer 100 relating to one embodiment. As shown in FIG. 2, the base wafer 102 is provided in a step S202. After this, in a step S204, the Group 3-5 compound semiconductor 104 is epitaxially grown on the main plane 103 of the base wafer 102.

Specifically speaking, a Group 3 source gas including an organometallic compound of a Group 3 element, a Group 5 source gas including a Group 5 element, and an impurity gas including impurities that are to serve as donors are supplied to the main plane 103 of the base wafer 102 to grow a p-type Group 3-5 compound semiconductor on the main plane 103. The amount of the n-type carriers to compensate for the p-type carriers in the Group 3-5 compound semiconductor varies depending on the flow rate of the impurity gas to be supplied along with the Group 3 source gas and the Group 5 source gas. Accordingly, the residual p-type carrier concentration can take an appropriate value by controlling the flow rate of the impurity gas depending on the flow rate ratio of the Group 5 source gas to the Group 3 source gas.

As used herein, the expression "the flow rate of the Group 3 source gas" refers to the volume flow rate of the Group 3 source gas, the expression "the flow rate of the Group 5 source gas" refers to the volume flow rate of the Group 5 source gas, and the expression "the flow rate of the impurity gas" refers to the volume flow rate of the impurity gas. The expression "the flow rate ratio of the Group 5 source gas to the Group 3 source gas" refers to the resulting value of dividing "the flow rate of the Group 5 source gas" by "the flow rate of the Group 3 source gas." This flow rate ratio is converted to the flow rate ratio of the Group 5 source gas to the Group 3 source gas at the temperature of 0° C. and at the pressure of 101.3 kPa (1 atm).

The Group 3 source gas is a source gas consisting of an organometallic compound of a Group 3 element. The Group 3 source gas is, for example, supplied into a reaction chamber together with a carrier gas. The Group 3 source gas includes, for example, an organometallic compound having an alkyl group, such as trimethylgallium (TMG), trimethyl aluminum (TMA) and trimethyl indium (TMI). The carbon number of the alkyl group is, for example, 1 to 3.

The Group 3 source gas can be supplied in the following manner. A source container having the organometallic compound therein is placed within a thermostatic bath, and the temperature is controlled so that the organometallic compound reaches a predetermined temperature. After this, a carrier gas such as $H_2$ is introduced into the source container to bubble the organometallic compound. In this way, the organometallic compound is vaporized. The carrier gas that has flown out of the source container contains a certain amount of the organometallic compound, the amount being determined by the saturated vapor pressure of the organometallic compound at the temperature of the thermostatic bath and the pressure within the source container.

When the Group 3 source gas is supplied to the reaction chamber together with the carrier gas, the flow rate of the Group 3 source gas can be calculated, with reference to the flow rate of the carrier gas supplied to the source container, using the saturated vapor pressure of the organometallic compound at the temperature of the thermostatic bath in which the source container is placed and the pressure within the source container. When a plurality of organometallic compounds are used as the Group 3 source, the expression "the flow rate of the Group 3 source gas" refers to the total of the flow rates of the organometallic compounds. For example, when a compound semiconductor is formed by using, as the Group 3 source gas, a first Group 3 source gas including TMA and a second Group 3 source gas including TMG, "the flow rate of the Group 3 source gas" denotes the sum of the flow rate of the first Group 3 source gas and the flow rate of the second Group 3 source gas.

The Group 5 source gas is a source gas consisting of a compound of a Group 5 element. The Group 5 source gas is, for example, supplied into the reaction chamber together with a carrier gas. The Group 5 source gas includes, for example, a hydride of a Group 5 element, such as arsine. The carbon in an organometallic compound including a Group 5 element is more unlikely to be taken into the crystal of the Group 3-5 compound semiconductor 104 than the carbon in an organometallic compound of a Group 3 element. Thus, the Group 5 source gas can include an organometallic compound of a Group 5 element, such as monoalkylarsine. An organometallic compound of a Group 5 element is, for example, an organometallic compound obtained by substituting at least one hydrogen of an hydride of the Group 5 element with an alkyl group having a carbon number of 1 to 4.

The Group 5 source gas is supplied in a similar manner to the Group 3 source gas. The flow rate of the Group 5 source gas is calculated in a similar manner to the flow rate of the Group 3 source gas. When a plurality of Group 5 element compounds are used, the flow rate of the Group 5 source gas is calculated by adding together the flow rates of the plurality of Group 5 element compounds.

The impurity gas includes impurities that are to serve as donors. The impurity gas can include a carrier gas. The impurities that are to serve as donors are, for example, at least one element selected from the group consisting of Si, Se, Ge, Sn, S and Te. The impurity gas can include a hydride of at least one of the above elements, or an alkylation product made up by at least one of the above elements and an alkyl group with a carbon number of 1-3.

The impurities behave as donor impurities within the crystal of the Group 3-5 compound semiconductor 104 and thus increase the n-type carrier concentration of the Group 3-5 compound semiconductor 104. When the flow rate ratio of the Group 5 source gas to the Group 3 source gas is set to as low as 50 or less, the carbon in the Group 3 source gas is taken into the crystal of the Group 3-5 compound semiconductor 104, which raises the p-type carrier concentration. By supplying the impurity gas together with the Group 3 source gas and the Group 5 source gas, however, the n-type carriers compensate for the p-type carriers. Thus, the residual p-type carrier concentration can be prevented from increasing.

Furthermore, the concentrations of the acceptor and donor impurities within the Group 3-5 compound semiconductor 104 can be controlled by regulating the flow rates of the Group 3 source gas, the Group 5 source gas, and the impurity gas. Accordingly, the residual p-type carrier concentration of the Group 3-5 compound semiconductor 104 can be controlled while using a reduced amount of the Group 5 source.

Specifically speaking, during the epitaxial growth of the Group 3-5 compound semiconductor 104 on the base wafer 102, the flow rate of the impurity gas and the flow rate ratio of the Group 5 source gas to the Group 3 source gas are set so that the product N×d ($cm^{-2}$) of the residual carrier concentration N ($cm^{-3}$) and the thickness d (cm) of the Group 3-5 compound semiconductor 104 may be $8.0 \times 10^{11}$ or less. In this way, the p-type carriers, which are generated according to the flow rate ratio of the Group 5 source gas to the Group 3 source gas, are compensated for by the impurity gas. As a result, the Group 3-5 compound semiconductor 104 that can behave sufficiently as a buffer layer can be grown while using a reduced amount of the Group 5 source.

As used herein, the expression "the residual carrier concentration of the Group 3-5 compound semiconductor 104" refers to the resulting value of subtracting the n-type carrier concentration from the p-type carrier concentration. This carrier concentration can be calculated from the capacitance-voltage (C-V) characteristics of the Group 3-5 compound semiconductor 104. The expression "the thickness of the Group 3-5 compound semiconductor 104" refers to the average thickness of a region suitable for a buffer layer of a semiconductor device such as a FET. The average thickness is, for example, an arithmetic mean of the thicknesses of the region at five different points. The thicknesses can be calculated by observation using an SEM or a TEM.

To lower the flow rate of the Group 5 source gas, it is preferable to supply the Group 3 source gas and the Group 5 source gas in such a manner that the flow rate ratio of the Group 5 source gas to the Group 3 source gas becomes 50 or less. In other words, the flow rates can be set such that the flow rate ratio of the Group 5 source gas to the Group 3 source gas becomes 50 or less and the product of the thickness of the Group 3-5 compound semiconductor 104 and the carrier concentration of the Group 3-5 compound semiconductor 104 becomes $8.0 \times 10^{11}$ $cm^{-2}$ or less. By growing the Group 3-5 compound semiconductor 104 under the above-described conditions, the concentrations of the acceptor and donor impurities within the Group 3-5 compound semiconductor 104 are controlled while using a significantly reduced amount of the Group 5 source gas.

By setting the flow rate ratio of the Group 5 source gas to the Group 3 source gas to 30 or less, the flow rate of the Group 5 source gas can be further reduced. Accordingly, it is more preferable to set the flow rate ratio to 30 or less. Note that the flow rate ratio of the Group 5 source gas to the Group 3 source gas is preferably 0.1 or more since both the Group 3 source gas and the Group 5 source gas are necessary to grow the Group 3-5 compound semiconductor 104.

During the epitaxial growth of the Group 3-5 compound semiconductor 104 on the base wafer 102, the ratio of the difference in flow rate between the Group 5 source gas and the Group 3 source gas to the flow rate of the impurity gas is preferably set to $9.0 \times 10^6$ or less. The ratio of the difference in flow rate between the Group 5 source gas and the Group 3 source gas to the flow rate of the impurity gas can be set to $8.4 \times 10^6$ or less. By setting the ratio of the difference in flow rate between the Group 5 source gas and the Group 3 source gas to the flow rate of the impurity gas to the above-mentioned range, the Group 3-5 compound semiconductor 104 that behaves sufficiently as a buffer layer can be grown.

The expression "the ratio of the difference in flow rate between the Group 5 source gas and the Group 3 source gas to the flow rate of the impurity gas" refers to the resulting value of dividing "the difference between the flow rate of the Group 5 source gas and the flow rate of the Group 3 source gas" by "the flow rate of the impurity gas." This ratio is converted to the ratio of the difference in flow rate between the Group 5 source gas and the Group 3 source gas to the flow rate of the impurity gas at the temperature of 0° C. and at the pressure of 101.3 kPa (1 atm). When the impurity gas is diluted with a different gas such as hydrogen, the flow rate of the impurity gas is converted to a flow rate of a pure impurity gas.

By using "the ratio of the difference in flow rate between the Group 5 source gas and the Group 3 source gas to the flow rate of the impurity gas" as an indicator of the relation among the flow rates of the impurity gas, the Group 5 source gas and the Group 3 source gas, it becomes easier to understand the relation between the p-type carrier concentration, which varies depending on the ratio and difference in flow rate between the Group 5 source gas and the Group 3 source gas, and the n-type carrier concentration, which varies depending on the impurity gas. Furthermore, if the ratio of the difference in flow rate between the Group 5 source gas and the Group 3 source gas to the flow rate of the impurity gas is set to a given value, determining the flow rate of one of the impurity gas, the Group 5 source gas, and the Group 3 source gas can uniquely determine the flow rates of the other gases.

In the present embodiment, the case where the ratio of the difference in flow rate between the Group 5 source gas and the Group 3 source gas to the flow rate of the impurity gas is controlled has been explained. However, the growth temperature of the reaction chamber, the pressure, and the crystal growth rate can also be controlled. The growth temperature of the reaction chamber during the crystal growth is appropriately selected within a temperature range satisfying such a condition that the rates of the reaction and decomposition of the sources do not vary irrespective of whether the growth temperature varies and the supply of the sources is the rate-controlling factor. For example, the growth temperature can be selected depending on the carrier concentration of an n-GaAs layer, which is a Group 3-5 compound semiconductor.

The growth pressure during the crystal growth is set based on the relation between the in-plane uniformity of the Group 3-5 compound semiconductor 104 to be grown and the source efficiency. Specifically speaking, as the growth pressure decreases, the in-plane uniformity improves but the source efficiency degrades. Therefore, the growth pressure is set optimally to balance these two factors. The crystal growth rate of the Group 3-5 compound semiconductor 104 is determined by the flow rate of the Group 3 source gas when the supply of the sources is the rate controlling factor. For example, the flow rate is determined in such a manner that the flow rate is positioned in the vicinity of the middle of the controllable range of the gas flowmeter provided in the growing apparatus and there is good linearity between the gas flow rate and the growth rate.

FIG. 3 schematically illustrates an exemplary cross-section of a semiconductor device 300 relating to one embodiment. The semiconductor device 300 includes the base wafer 102, the Group 3-5 compound semiconductor 104, and an active layer 310 in the stated order. The Group 3-5 compound semiconductor 104 can be formed in a similar manner as the case of the compound semiconductor epitaxial wafer 100. The active layer 310 is, for example, a Group 3-5 compound semiconductor.

FIG. 4 schematically illustrates an exemplary cross-section of a compound semiconductor epitaxial wafer 400 relating to another embodiment. The compound semiconductor epitaxial wafer 400 includes the base wafer 102, the Group 3-5 compound semiconductor 104, the active layer 310, and a contact layer 420 in the stated order. The compound semiconductor epitaxial wafer 400 is an exemplary semiconductor wafer.

The base wafer 102 includes, for example, a Group 3-5 compound semiconductor such as GaAs or a Group 4 semiconductor represented as $Si_xGe_{1-x}$ ($0 \leq x \leq 1$). The base wafer 102 can be a semi-insulative GaAs wafer. The base wafer 102 can be such a semi-insulative single-crystal GaAs wafer that the crystallographic plane orientation of the surface of the base wafer 102 is inclined with respect to the crystallographic plane orientation of the (100) plane or a plane crystallographically equivalent to the (100) plane and the inclination is no less than 0.05° and no more than 1°. The base wafer 102 can be a laminate wafer structured such that a Group 3-5 compound semiconductor such as GaAs is formed on a Si wafer, a silicon-on-insulator (SOI) wafer, a Ge wafer or germanium-on-insulator (GOI) wafer.

The Group 3-5 compound semiconductor 104 is obtained, for example, by supplying a Group 3 source gas, a Group 5 source gas, and an impurity gas into a reduced-pressure barrel-type reaction chamber in which the base wafer 102 has been placed to grow a Group 3-5 compound semiconductor on the main plane 103 of the base wafer 102. Here, the p-type carrier concentration of the Group 3-5 compound semiconductor 104 can be controlled while using a reduced amount of the Group 5 source, by supplying the Group 3 source gas and the Group 5 source gas such that the flow rate ratio of the Group 5 source gas to the Group 3 source gas is 50 or less, more preferably 30 or less. In addition to the Group 3 source gas, the Group 5 source gas, and the impurity gas, a carrier gas, a balance gas, and other source gases can be supplied to the reaction chamber.

The flow rate of the impurity gas and the flow rate ratio of the Group 5 source gas to the Group 3 source gas are preferably set such that the residual capacitance per unit area resulting from the residual charges becomes less than 0.5 nF/cm² according to capacitance-voltage measurement performed on the compound semiconductor epitaxial wafer 400 using a Schottky electrode. The flow rate of the impurity gas and the flow rate ratio of the Group 5 source gas to the Group 3 source gas can be set such that the flow rate ratio of the Group 5 source gas to the Group 3 source gas becomes 50 or less, the product of the thickness of the Group 3-5 compound semiconductor 104 and the carrier concentration of the Group 3-5 compound semiconductor 104 becomes $8.0 \times 10^{11}$ cm$^{-2}$ or less, and the residual capacitance per unit area resulting from the residual charges becomes less than 0.5 nF/cm² according to capacitance-voltage measurement performed on the compound semiconductor epitaxial wafer 400.

The capacitance-voltage measurement can be performed on the Group 3-5 compound semiconductor 104, for example, by applying a voltage to a Schottky electrode that is in contact with the active layer 310 and formed by removing the contact layer 420 of the compound semiconductor epitaxial wafer 400 by etching or the like. The Schottky electrode can be made of Al, Ag, Au, Cu and the like. The Schottky electrode is not shown in FIG. 4.

For example, the Schottky electrode can be formed by forming, on the surface of the active layer 310, an inner electrode and an outer electrode that externally surrounds the inner electrode and is separated away from the inner electrode. An opening can be formed inside of the outer electrode. The inner electrode is, for example, formed in the opening. The center of the inner electrode can substantially coincide with the center of the outer electrode. The center of the opening can substantially coincide with the center of the outer electrode. The center of the opening can substantially coincide with the center of the inner electrode.

The inner electrode is, for example, shaped like a circle. The shape of the opening can be similar to the shape of the inner electrode. The opening is preferably sized larger than the inner electrode. The area of the outer electrode is preferably ten or more times, more preferably 1000 or more times larger than the area of the inner electrode. The area of the outer electrode can be 2 cm² or more. The external shape of the outer electrode is not limited to a particular shape and can be similar to the shape of the inner electrode.

The external shape of the outer electrode can be a regular polygon. For example, a circular inner electrode, a circular opening, and a square outer electrode are formed in such a manner that their centers coincide with each other. The capacitance-voltage measurement can be performed by applying a voltage between the inner electrode and the outer electrode. According to this technique, the value of the capacitance of each material can be calculated based on the value of the area of the inner electrode and the value of the interval between the inner electrode and the outer electrode.

The active layer 310 includes, for example, a Group 3-5 compound semiconductor such as GaAs, AlGaAs, InGaP, and InGaAs. The active layer 310 can include strained InGaAs. The active layer 310 functions, for example, as a FET active layer. The contact layer 420 can include a Group 3-5 compound semiconductor such as GaAs and InGaAs.

Figure 5:
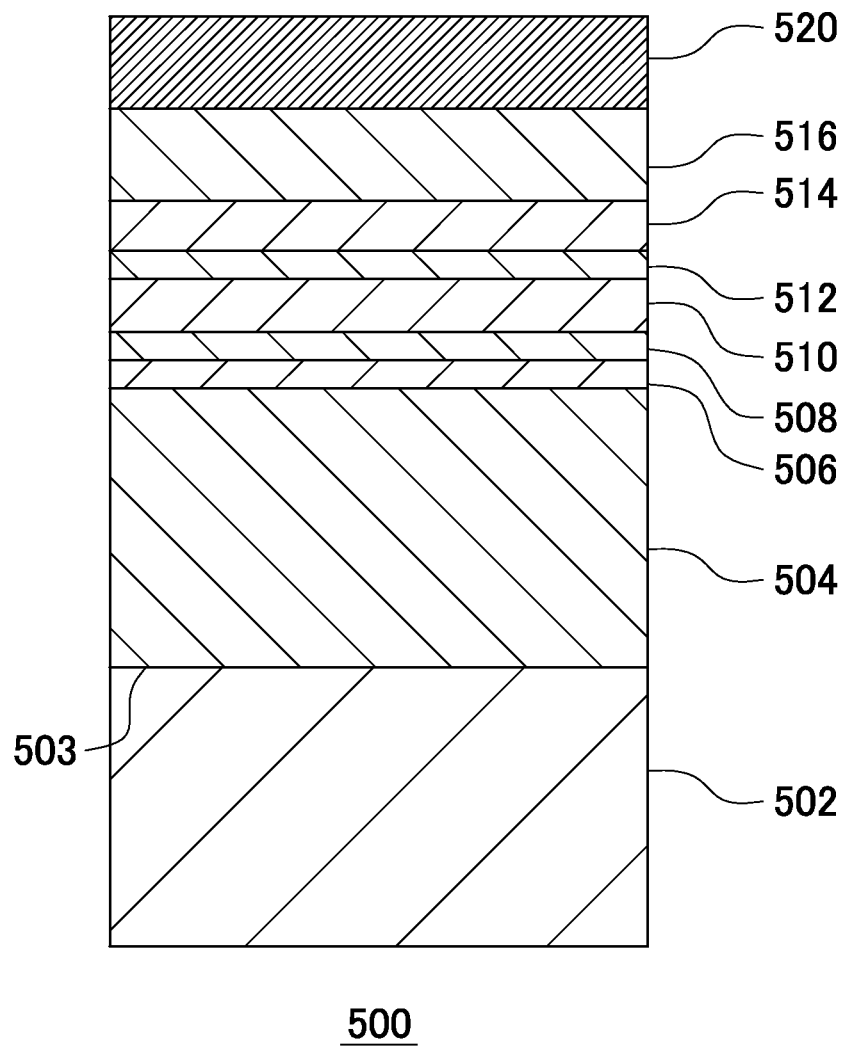
FIG. 5 schematically illustrates an exemplary cross-section of a compound semiconductor epitaxial wafer 500.

FIG. 5 schematically illustrates an exemplary cross-section of a compound semiconductor epitaxial wafer 500 relating to yet another embodiment. The compound semiconductor epitaxial wafer 500 includes a base wafer 502, a buffer layer 504, a back-side electron supply layer 506, a back-side spacer layer 508, a channel layer 510, a front-side spacer layer 512, a front-side electron supply layer 514, a barrier layer 516 and a contact layer 520 in the stated order. The compound semiconductor epitaxial wafer 500 is an exemplary semiconductor wafer. The buffer layer 504 is formed on a main plane 503 of the base wafer 502 by crystal growth. The channel layer 510 is an exemplary active layer.

The base wafer 502 has similar configuration to the base wafer 102. The buffer layer 504 has similar configuration to the Group 3-5 compound semiconductor 104. The buffer layer 504 can include a plurality of layers. At least some of the layers of the buffer layer 504 can have similar configuration to the Group 3-5 compound semiconductor 104. The buffer layer 504 has, for example, a thickness of no less than 10 nm and no more than 3000 nm. The channel layer 510 has similar configuration to the active layer 310. The contact layer 520 has similar configuration to the contact layer 420. Therefore, the base wafer 502, the buffer layer 504, the channel layer 510, and the contact layer 520 are not described here.

The back-side electron supply layer 506 and the front-side electron supply layer 514 supply electrons to the channel layer 510. The back-side electron supply layer 506 and the front-side electron supply layer 514 can include a Group 3-5 compound semiconductor such as AlGaAs. The back-side spacer layer 508 and the front-side spacer layer 512 can have a compound semiconductor having a wider bandgap than the compound semiconductor included in the channel layer 510. The barrier layer 516 includes a Group 3-5 compound semiconductor such as AlGaAs. In the barrier layer 516, a gate electrode of an electronic element such as a FET is formed. The contact layer 520 includes, for example, a Group 3-5 compound semiconductor such as GaAs and InGaAs.

When a capacitance is formed by the buffer layer 504, capacitance-voltage measurement can be performed on the compound semiconductor epitaxial wafer 500 by, for example, applying a voltage to a pair of Schottky electrodes that are formed on the barrier layer 516 after removing the contact layer 520 by etching or the like. The Schottky electrodes can be made of Al, Ag, Au, Cu and the like. The Schottky electrodes are not shown in FIG. 5.

Figure 6:
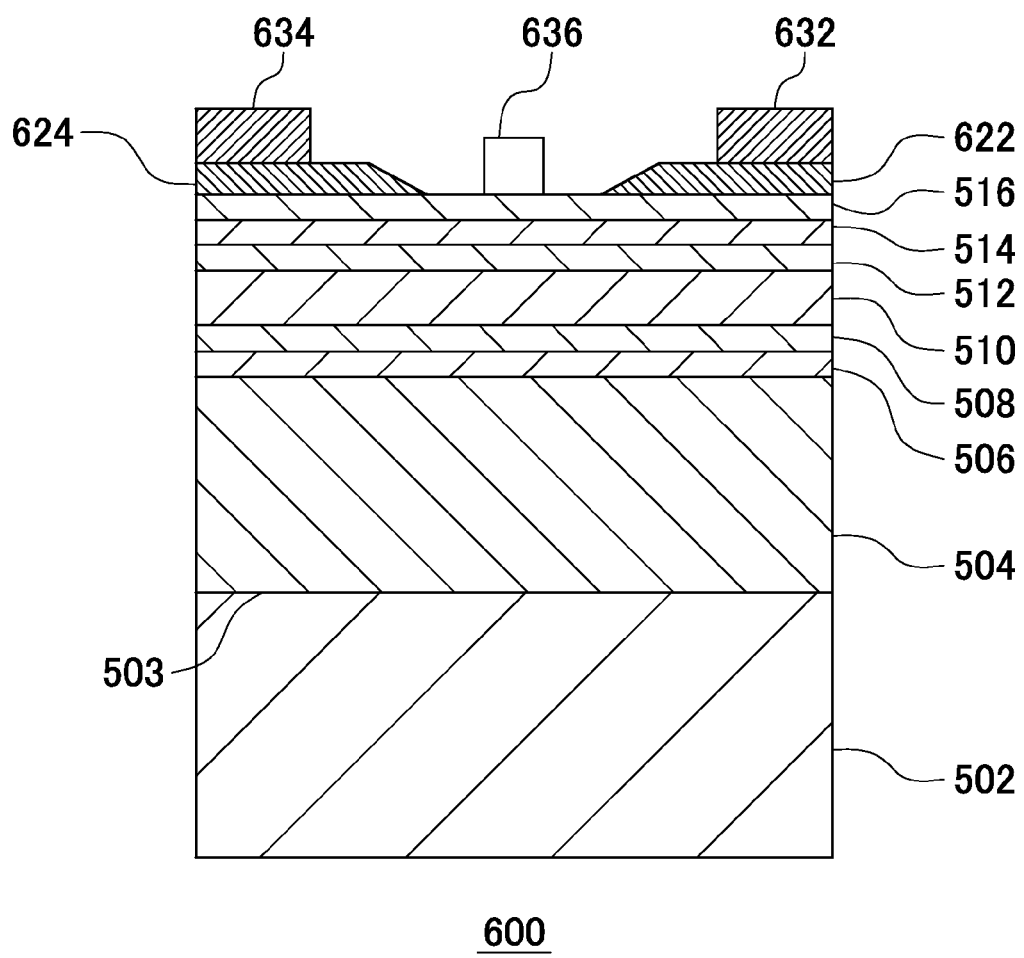
FIG. 6 schematically illustrates an exemplary cross-section of a semiconductor device 600.

FIG. 6 schematically illustrates an exemplary cross-section of a semiconductor device 600 relating to another embodiment. The semiconductor device 600 is, for example, a HEMT. The semiconductor device 600 includes the base wafer 502, the buffer layer 504, the back-side electron supply layer 506, the back-side spacer layer 508, the channel layer 510, the front-side spacer layer 512, the front-side electron supply layer 514, and the barrier layer 516 in the stated order. The semiconductor device 600 includes a contact layer 622 and a contact layer 624 that are in contact with the barrier layer 516, and a control electrode 636. The semiconductor device 600 includes a drain electrode 632 in contact with the contact layer 622, and a source electrode 634 in contact with the contact layer 624.

The drain electrode 632 and the source electrode 634 form ohmic contact with the contact layer 622 and the contact layer 624, for example. The contact layer 622 and the contact layer 624 include, for example, a Group 3-5 compound semiconductor such as GaAs and InGaAs. The control electrode 636 controls the currents flowing into the drain electrode 632 and the source electrode 634. The drain electrode 632, the source electrode 634, and the control electrode 636 can be made of metals including aluminum, copper, gold, silver, platinum and tungsten, and an alloy thereof, or a heavily doped semiconductor such as silicon.

The semiconductor device 600 is produced in the following manner, for example. To begin with, the compound semiconductor epitaxial wafer 500 shown in FIG. 5 is provided. Subsequently, the contact layer 520 of the compound semiconductor epitaxial wafer 500 is partially patterned and removed by etching or the like to form the contact layer 622 and the contact layer 624 and externally expose the barrier layer 516. After this, the drain electrode 632, the source electrode 634, and the control electrode 636 are formed. In this manner, the semiconductor device 600 can be produced.

In the present embodiment, the case where the semiconductor device is a HEMT has been explained. However, the semiconductor device is not limited to a HEMT. The semiconductor device can be an electronic device such as an HBT or a FET, but also can be a light emitting element, a light receiving element or a semiconductor circuit.

IMPLEMENTATION EXAMPLES

Implementation Example 1

The compound semiconductor epitaxial wafer 500 was produced in the following manner. As the base wafer 502, a semi-insulative GaAs single-crystal wafer was provided. The provided GaAs single-crystal wafer was placed within a reduced-pressure barrel-type MOCVD furnace. Subsequently, as the buffer layer 504, p-$Al_{0.25}Ga_{0.75}As$ was formed to a thickness of 500 nm. As the Group 3 source gas for the p-$Al_{0.25}Ga_{0.75}As$, a first Group 3 source gas including TMA and a second Group 3 source gas including TMG were used. Furthermore, as the Group 5 source gas, a source gas including arsine ($AsH_3$) was used. As the impurity gas, a gas including disilane ($Si_2H_6$) was used. The flow rate of the impurity gas was set such that the flow rate of disilane became $6.20 \times 10^{-5}$ $cm^3$/min when converted to the conditions of 101.3 kPa and 0° C. As the carrier gas, highly pure hydrogen was used.

While the buffer layer 504 was formed, the first Group 3 source gas, the second Group 3 source gas, and the Group 5 source gas were supplied to the MOCVD furnace in such a manner that the flow rate ratio of the Group 5 source gas to the Group 3 source gas became 30. Specifically speaking, the flow rate of the first Group 3 source gas was set such that the flow rate of TMA became 2.7 $cm^3$/min when converted to the conditions of 101.3 kPa and 0° C. The flow rate of the second Group 3 source gas was set such that the flow rate of TMG became 10.6 $cm^3$/min when converted to the conditions of 101.3 kPa and 0° C. The flow rate of the Group 5 source gas was set such that the flow rate of arsine became 400 $cm^3$/min when converted to the conditions of 101.3 kPa and 0° C. Other crystal growth conditions were selected such that the growth pressure within the MOCVD furnace was 10.13 kPa, the growth temperature was 650° C. and the growth rate was 1 to 3 μm/hr.

The difference in flow rate between the Group 5 source gas and the Group 3 source gas was 386.7 $cm^3$/min. Therefore, the ratio of the difference in flow rate between the Group 5 source gas and the Group 3 source gas to the flow rate of the impurity gas was $6.24 \times 10^6$. The flow rate ratio of the Group 5 source gas to the impurity gas was $6.45 \times 10^6$.

After this, as the back-side electron supply layer 506, n-$Al_{0.22}Ga_{0.78}As$ was formed to a thickness of 3 nm. The residual n-type carrier concentration of the back-side electron supply layer 506 was $3 \times 10^{18}$ $cm^{-3}$. Subsequently, as the back-side spacer layer 508, i-$Al_{0.22}Ga_{0.78}As$ was formed to a thickness of 3 nm.

Following this, as the channel layer 510, a strained InGaAs layer was formed. As the strained InGaAs layer, i-$In_{0.20}Ga_{0.80}As$ was formed to a thickness of 14 nm. As the Group 3 source gas for the i-$In_{0.20}Ga_{0.80}As$, a first Group 3 source gas including TMI and a second Group 3 source gas including TMG were used.

Subsequently, as the front-side spacer layer 512, i-$Al_{0.22}Ga_{0.78}As$ was formed to a thickness of 3 nm. After this, as the front-side electron supply layer 514, n-$Al_{0.22}Ga_{0.78}As$ was formed to a thickness of 9 nm. The residual n-type carrier concentration of the front-side electron supply layer 514 was $3 \times 10^{18}$ $cm^{-3}$. Lastly, as the barrier layer 516, i-$Al_{0.22}Ga_{0.78}As$ was formed to a thickness of 50 nm.

Figure 8:
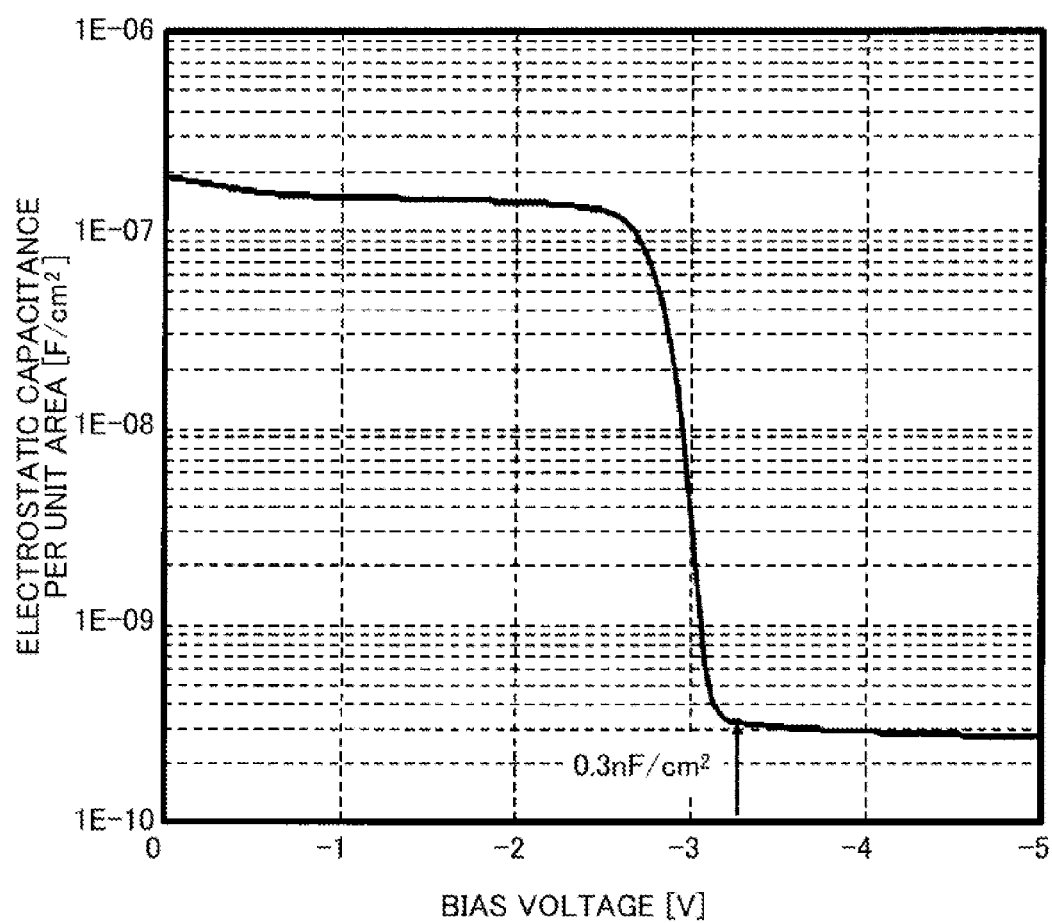
FIG. 8 shows the results of the capacitance-voltage measurement performed on the compound semiconductor epitaxial wafer of Implementation Example 1.

FIG. 7 shows results of capacitance-voltage measurement performed on the compound semiconductor epitaxial wafer of Implementation Example 1. In FIG. 7, the horizontal axis represents the bias voltage [V] and the vertical axis represents the electrostatic capacitance [F]. FIG. 8 shows the results of the capacitance-voltage measurement shown in FIG. 7 with the vertical axis representing the electrostatic capacitance per unit area [$F/cm^2$]. The capacitance-voltage measurement was performed by using a Schottky electrode formed on the surface of the barrier layer 516.

As the Schottky electrode, an outer electrode having an opening therein and an inner electrode positioned in the opening were formed. The inner electrode was shaped as a circle having a diameter of 500 μm. The opening in the outer electrode was shaped as a circle having a diameter of 540 μm. The external shape of the outer electrode was circular. The area of the outer electrode was 2 $cm^2$ or more. The inner electrode, the outer electrode, and the opening were designed such that their centers coincided with each other. The outer electrode and the inner electrode were made of Al. The capacitance-voltage measurement was performed by applying a voltage between the inner electrode and the outer electrode.

As shown in FIG. 7, the residual capacitance was less than 1 pF. As shown in FIG. 8, the residual capacitance per unit area was less than the value obtained by dividing 1 pF by the area of the inner electrode ($2.0 \times 10^{-3}$ cm$^2$), or less than 0.5 nF/cm$^2$. According to the capacitance-voltage measurement, the electrostatic capacitance steeply dropped when the bias voltage was in a range from approximately 2.6 V to approximately 3.1 V. Thus, superior pinch-off characteristics were exhibited. The pinch-off voltage was −2.8 V. Here, the pinch-off voltage refers to the voltage that produces an n-type carrier concentration of $1 \times 10^{15}$ cm$^{-3}$.

The results of the capacitance-voltage measurement were used to calculate the p-type carrier concentration and the residual p-type carrier concentration of the buffer layer 504. Here, the p-type carrier concentration of the buffer layer 504 refers to the p-type carrier concentration of the buffer layer 504 that is formed without being doped with disilane. On the other hand, the residual p-type carrier concentration of the buffer layer 504 refers to the p-type carrier concentration of the buffer layer 504 after the p-type carriers have been compensated for by the n-type carriers resulting from incorporation of disilane.

The p-type carrier concentration of the buffer layer 504 was $3.3 \times 10^{16}$ cm$^{-3}$, and the residual p-type carrier concentration was $5.0 \times 10^{15}$ cm$^{-3}$. In other words, the product of the thickness of the buffer layer 504 and the residual p-type carrier concentration of the buffer layer 504 was $2.5 \times 10^{11}$ cm$^{-2}$, thus no more than $8.0 \times 10^{11}$ cm$^{-2}$.

Furthermore, withstand voltage measurement was performed on the buffer layer 504. According to the withstand voltage measurement, a withstand voltage resulting from electron conduction and a withstand voltage resulting from hole conduction were measured. The withstand voltage measurement was performed in the following manner. To begin with, the surface of the compound semiconductor epitaxial wafer 500 was etched away to a depth of 130 nm to externally expose the buffer layer 504. Subsequently, counter electrodes were provided on the externally exposed buffer layer. The distance between the counter electrodes was set to 5 µm. The counter electrodes had a width of 200 µm. The withstand voltage resulting from electron conduction was measured using a AuGe/Ni/Au electrode. The withstand voltage resulting from hole conduction was measured using a AuZn electrode. The withstand voltage resulting from electron conduction was 22 V and the withstand voltage resulting from hole conduction was 48V. Thus, superior buffer withstand voltages were achieved.

Furthermore, hall measurement was performed on the compound semiconductor epitaxial wafer 500. The hall measurement was performed using the Van der Pauw method. The two-dimensional electron gas concentration at 300 K was $2.4 \times 10^{12}$ cm$^{-2}$. The electron mobility at 300 K was 7600 cm$^2$/Vs. The two-dimensional electron gas concentration at 77 K was $2.5 \times 10^{12}$ cm$^{-2}$. The electron mobility at 77 K was 24000 cm$^2$/Vs.

Implementation Example 2

In Implementation Example 2, a compound semiconductor epitaxial wafer 500 having similar configuration to the compound semiconductor epitaxial wafer 500 of Implementation Example 1 was produced with the flow rate ratio of the Group 5 source gas to the Group 3 source gas being set to 30 and the flow rate of the impurity gas being set lower. The compound semiconductor epitaxial wafer 500 of Implementation Example 2 was produced in a similar manner to the compound semiconductor epitaxial wafer 500 of Implementation example 1 except for that the buffer layer 504 was formed with the flow rate of the impurity gas being set lower. Specifically speaking, the flow rate of the impurity gas was set such that the flow rate of disilane became $5.40 \times 10^{-5}$ cm$^3$/min when converted to the standard conditions of 101.3 kPa and 0° C.

In Implementation Example 2, the difference in flow rate between the Group 5 source gas and the Group 3 source gas was 386.7 cm$^3$/min as in Implementation Example 1. Since the flow rate of disilane, which was the impurity gas, was $5.40 \times 10^{-5}$ cm$^3$/min, the ratio of the difference in flow rate between the Group 5 source gas and the Group 3 source gas to the flow rate of the impurity gas was $7.16 \times 10^6$. The flow rate ratio of the Group 5 source gas to the impurity gas was $7.41 \times 10^6$.

Referring to the compound semiconductor epitaxial wafer 500 of Implementation Example 2, the p-type carrier concentration of the buffer layer 504, that is, the p-type carrier concentration of the buffer layer 504 that was formed without being doped with disilane was $3.3 \times 10^{16}$ cm$^{-3}$. The residual p-type carrier concentration, that is, the p-type carrier concentration after the p-type carriers had been compensated for by the n-type carriers resulting from incorporation of disilane was $8.0 \times 10^{15}$ cm$^{-3}$. Consequently, the product of the thickness of the buffer layer 504 and the carrier concentration of the buffer layer 504 became $4.0 \times 10^{11}$ cm$^{-2}$, thus smaller than $8.0 \times 10^{11}$ cm$^{-2}$.

Referring to the buffer layer 504 of Implementation Example 2, the withstand voltage resulting from electron conduction was 23 V and the withstand voltage resulting from hole conduction was 37 V. The withstand voltage resulting from hole conduction was lower than the withstand voltage of the buffer layer 504 of Implementation Example 1, but sufficiently good buffer withstand voltage was achieved.

Implementation Example 3

In Implementation Example 3, a compound semiconductor epitaxial wafer 500 having similar configuration to the compound semiconductor epitaxial wafers 500 of Implementation Examples 1 and 2 was produced with the flow rate ratio of the Group 5 source gas to the Group 3 source gas being set to 30 and the flow rate of the impurity gas being set further lower. The compound semiconductor epitaxial wafer 500 of Implementation Example 3 was produced in a similar manner to the compound semiconductor epitaxial wafers 500 of Implementation Examples 1 and 2 except for that the buffer layer 504 was formed with the flow rate of the impurity gas being set lower. Specifically speaking, the flow rate of the impurity gas was set such that the flow rate of disilane became $4.58 \times 10^{-5}$ cm$^3$/min when converted to the standard conditions of 101.3 kPa and 0° C.

In Implementation Example 3, the difference in flow rate between the Group 5 source gas and the Group 3 source gas was 386.7 cm$^3$/min as in Implementation Example 1. Since the flow rate of disilane, which was the impurity gas, was $4.58 \times 10^{-5}$ cm$^3$/min, the ratio of the difference in flow rate between the Group 5 source gas and the Group 3 source gas to the flow rate of the impurity gas was $8.44 \times 10^6$. The flow rate ratio of the Group 5 source gas to the impurity gas was $8.73 \times 10^6$.

Referring to the compound semiconductor epitaxial wafer 500 of Implementation Example 3, the p-type carrier concentration of the buffer layer 504, that is, the p-type carrier concentration of the buffer layer 504 that was formed without being doped with disilane was $3.3 \times 10^{16}$ cm$^{-3}$. The residual p-type carrier concentration, that is, the p-type carrier concentration after the p-type carriers have been compensated for by the n-type carriers resulting from the incorporation of disilane was $1.4 \times 10^{16}$ cm$^{-3}$. Consequently, the product of the thickness of the buffer layer 504 and the carrier concentration of the buffer layer 504 became $7.0 \times 10^{11}$ cm$^{-2}$, thus smaller than $8.0 \times 10^{11}$ cm$^{-2}$.

Referring to the buffer layer 504 of Implementation Example 2, the withstand voltage resulting from electron conduction was 25 V and the withstand voltage resulting from hole conduction was 26 V. The withstand voltage resulting from hole conduction was further lower than the withstand voltage of the buffer layer 504 of Implementation Example 2, but sufficiently good buffer withstand voltage was achieved.

Comparative Example 1

In Comparative Example 1, a compound semiconductor epitaxial wafer having similar configuration to the compound semiconductor epitaxial wafer 500 of Implementation Example 1 was produced with the flow rate ratio of the Group 5 source gas to the Group 3 source gas being set to 70. The compound semiconductor epitaxial wafer of Comparative Example 1 was produced under similar conditions to the compound semiconductor epitaxial wafer 500 of Implementation Example 1 except for that the buffer layer was formed with the flow rate ratio of the Group 5 source gas to the Group 3 source gas being set to 70 and without the impurity gas. Specifically speaking, the flow rate of the first Group 3 source gas was set such that the flow rate of TMA became 2.7 cm$^3$/min when converted to the standard conditions of 101.3 kPa and 0° C. The flow rate of the second Group 3 source gas was set such that the flow rate of TMG became 10.6 cm$^3$/min when converted the standard conditions of 101.3 kPa and 0° C. The flow rate of the Group 5 source gas was set such that the flow rate of arsine became 930 cm$^3$/min when converted to the standard conditions of 101.3 kPa and 0° C.

Referring to the compound semiconductor epitaxial wafer of Comparative Example 1, the p-type carrier concentration of the buffer layer was $5 \times 10^{15}$ cm$^{-3}$. Consequently, the product of the thickness of the buffer layer and the carrier concentration of the buffer layer was $2.5 \times 10^{11}$ cm$^{-2}$, thus no more than $8.0 \times 10^{11}$ cm$^{-2}$. In Comparative Example 1, the residual p-type carrier concentration is equal to the p-type carrier concentration.

Capacitance-voltage measurement was performed on the compound semiconductor epitaxial wafer of Comparative Example 1, in a similar manner to the compound semiconductor epitaxial wafer of Implementation Example 1. The results indicated that the residual capacitance was less than 1 pF and the residual capacitance per unit area was 0.5 nF/cm$^2$. Thus, superior pinch-off characteristics were exhibited. According to the capacitance-voltage measurement, the pinch-off voltage, or the voltage that produces an n-type carrier concentration of $1 \times 10^{15}$ cm$^{-3}$ was $-2.9$ V.

Withstand voltage measurement was performed on the buffer layer of Comparative Example 1, in a similar manner to the buffer layer 504 of Implementation Example 1. The withstand voltage resulting from electron conduction was 26 V and the withstand voltage resulting from hole conduction was 42V. Thus, superior buffer withstand voltage was achieved.

Hall measurement was performed on the compound semiconductor epitaxial wafer of Comparative Example 1, in a similar manner to the compound semiconductor epitaxial wafer 500 of Implementation Example 1. The two-dimensional electron gas concentration at 300 K was $2.4 \times 10^{12}$ cm$^{-2}$. The electron mobility at 300 K was 7600 cm$^2$/Vs. The two-dimensional electron gas concentration at 77 K was $2.5 \times 10^{12}$ cm$^{-2}$. The electron mobility at 77 K was 25000 cm$^2$/Vs.

Comparative Example 2

In Comparative Example 2, a compound semiconductor epitaxial wafer having similar configuration to the compound semiconductor epitaxial wafer 500 of Implementation Example 1 was produced with the flow rate ratio of the Group 5 source gas to the Group 3 source gas being set to 30 and the flow rate of the impurity gas being set lower. The compound semiconductor epitaxial wafer of Comparative Example 2 was produced in a similar manner to the compound semiconductor epitaxial wafer 500 of Implementation Example 1 except for that the buffer layer was formed with the flow rate of the impurity gas being set lower. Specifically speaking, the flow rate of the impurity gas was set such that the flow rate of disilane became $4.12 \times 10^{-5}$ cm$^3$/min when converted to the standard conditions of 101.3 kPa and 0° C.

In Comparative Example 2, the difference in flow rate between the Group 5 source gas and the Group 3 source gas was 386.7 cm$^3$/min as in Implementation Example 1. Since the flow rate of disilane, which was the impurity gas, was $4.12 \times 10^{-5}$ cm$^3$/min, the ratio of the difference in flow rate between the Group 5 source gas and the Group 3 source gas to the flow rate of the impurity gas was $9.39 \times 10^6$. The flow rate ratio of the Group 5 source gas to the impurity gas was $9.71 \times 10^6$.

Referring to the compound semiconductor epitaxial wafer of Comparative Example 2, the p-type carrier concentration of the buffer layer, that is, the inherent p-type carrier concentration of the buffer layer without being doped with disilane was $3.3 \times 10^{16}$ cm$^{-3}$. The residual p-type carrier concentration, that is, the p-type carrier concentration after the p-type carriers had been compensated for by the n-type carriers was $2.0 \times 10^{16}$ cm$^{-3}$. Consequently, the product of the thickness of the buffer layer 504 and the carrier concentration of the buffer layer 504 was $1.0 \times 10^{12}$ cm$^{-2}$, thus larger than $8.0 \times 10^{11}$ cm$^{-2}$.

Figure 10:
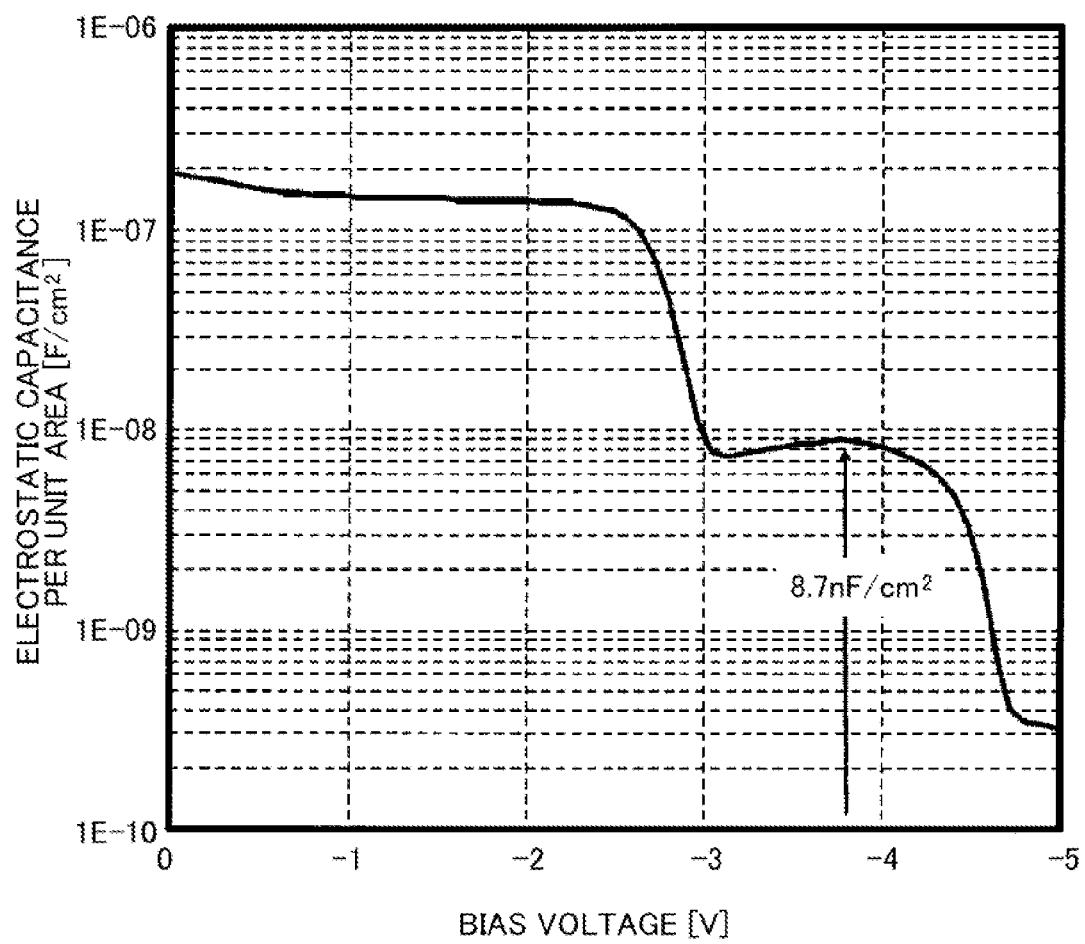
FIG. 10 shows the results of the capacitance-voltage measurement performed on the compound semiconductor epitaxial wafer of Comparative Example 2.

FIG. 9 shows results of capacitance-voltage measurement performed on the compound semiconductor epitaxial wafer of Comparative Example 2. FIG. 10 shows the results of the capacitance-voltage measurement shown in FIG. 9 with the vertical axis representing the electrostatic capacitance per unit area [F/cm$^2$]. Capacitance-voltage measurement was performed on the compound semiconductor epitaxial wafer of Comparative Example 2, in a similar manner to the compound semiconductor epitaxial wafer 500 of Implementation Example 1. As shown in FIG. 9, the p-type carriers remained and a residual capacitance of 17 pF was generated. The residual capacitance per unit area was calculated as 8.7 nF/cm$^2$ by dividing the residual capacitance 17 pF by the area of the inner electrode ($2.0 \times 10^{-3}$ cm$^2$).

Comparing FIGS. 9 and 10 against FIGS. 7 and 8 reveals that the pinch-off characteristics degraded. Specifically speaking, the residual capacitance dropped down to 17 pF when the bias voltage was in a range from approximately 2.6 V to approximately 3.0 V and then further dropped when the bias voltage was approximately 4.5 V or more. This is considered to be due to the fact that the p-type carriers remained when the voltage was approximately 4.5 V or less because the p-type carriers have a deep energy level. In Comparative Example 2, the pinch-off voltage, or the voltage that produces an n-type carrier concentration of $1 \times 10^{15}$ cm$^3$ was $-2.5$ V.

Withstand voltage measurement was performed on the buffer layer of Comparative Example 2, in a similar manner to the buffer layer 504 of Implementation Example 1. The withstand voltage resulting from electron conduction was 23 V and the withstand voltage resulting from hole conduction was 7 V. This indicates that the withstand voltage resulting from hole conduction significantly degrades compared with Implementation Examples 1, 2, and 3 and Comparative Example 1.

Hall measurement was performed on the compound semiconductor epitaxial wafer of Comparative Example 2, in a similar manner to the compound semiconductor epitaxial wafer 500 of Implementation Example 1. The two-dimensional electron gas concentration at 300 K was $2.1 \times 10^{12}$ cm$^{-2}$. The electron mobility at 300 K was 7600 cm$^2$/Vs. The two-dimensional electron gas concentration at 77 K was $2.1 \times 10^{12}$ cm$^{-2}$. The electron mobility at 77 K was 25000 cm$^2$/Vs. The two-dimensional electron gas concentration is considered to be lowered by a neutral region generated by the p-type carriers.

Table 1 shows the buffer growth conditions in Implementation Examples 1 to 3 and Comparative Examples 1 and 2. Table 2 shows resultantly grown buffers in Implementation Examples 1 to 3 and Comparative Examples 1 and 2. The n withstand voltage in Table 2 refers to the withstand voltage resulting from electron conduction. The p withstand voltage refers to the withstand voltage resulting from hole conduction. Table 3 shows the characteristics of the active layers in Implementation Examples 1 to 3 and Comparative Examples 1 and 2.

TABLE 1

BUFFER GROWTH CONDITIONS

| | FLOW RATE OF DISILANE [cm$^3$/min] | V/III RATIO | TMG [cm$^3$/min] | TMA [cm$^3$/min] | AsH$_3$ [cm$^3$/min] | V-III FLOW RATE DIFFERENCE [cm$^3$/min] | V-III FLOW RATE DIFFERENCE/ DISILANE RATIO | AsH$_3$/ DISILANE RATIO |
|---|---|---|---|---|---|---|---|---|
| IMPLEMENTATION EXAMPLE 1 | 6.20E−05 | 30 | 10.6 | 2.7 | 400 | 386.7 | 6.24E+06 | 6.45E+06 |
| IMPLEMENTATION EXAMPLE 2 | 5.40E−05 | 30 | 10.6 | 2.7 | 400 | 386.7 | 7.16E+06 | 7.41E+06 |
| IMPLEMENTATION EXAMPLE 3 | 4.58E−05 | 30 | 10.6 | 2.7 | 400 | 386.7 | 8.44E+06 | 8.73E+06 |
| COMPARATIVE EXAMPLE 1 | 0 | 70 | 10.6 | 2.7 | 930 | — | — | — |
| COMPARATIVE EXAMPLE 2 | 4.12E−05 | 30 | 10.6 | 2.7 | 400 | 386.7 | 9.39E+06 | 9.71E+06 |

TABLE 2

RESULTANTLY GROWN BUFFERS

| | THICKNESS [nm] | P CONCENTRATION [/cm$^3$] | RESIDUAL P CONCENTRATION [/cm$^3$] | THICKNESS × RESIDUAL P CONCENTRATION | N WITHSTAND VOLTAGE [V] | P WITHSTAND VOLTAGE [V] |
|---|---|---|---|---|---|---|
| IMPLEMENTATION EXAMPLE 1 | 500 | 3.3E+16 | 5.0E+15 | 2.5E+11 | 22 | 48 |
| IMPLEMENTATION EXAMPLE 2 | 500 | 3.3E+16 | 8.0E+15 | 4.0E+11 | 23 | 37 |
| IMPLEMENTATION EXAMPLE 3 | 500 | 3.3E+16 | 1.4E+16 | 7.0E+11 | 25 | 26 |
| COMPARATIVE EXAMPLE 1 | 500 | 5.0E+15 | 5.0E+15 | 2.5E+11 | 26 | 42 |
| COMPARATIVE EXAMPLE 2 | 500 | 3.3E+16 | 2.0E+16 | 1.0E+12 | 23 | 7 |

TABLE 3

CHARACTERISTICS OF ACTIVE LAYER

| | PINCH-OFF VOLTAGE [V] | Ns (ROOM TEMPERATURE) [/cm$^2$] | MOBILITY (ROOM TEMPERATURE) [cm$^3$/Vs] | Ns (77K) [/cm$^2$] | MOBILITY (77K) [cm$^3$/Vs] | RESIDUAL CAPACITANCE [nF/cm$^2$] |
|---|---|---|---|---|---|---|
| IMPLEMENTATION EXAMPLE 1 | −2.8 | 2.4E+12 | 7600 | 2.5E+12 | 24000 | <0.5 |
| IMPLEMENTATION EXAMPLE 2 | −2.7 | 2.4E+12 | 7700 | 2.5E+12 | 25000 | <0.5 |
| IMPLEMENTATION EXAMPLE 3 | −2.6 | 2.3E+12 | 7800 | 2.4E+12 | 26000 | <0.5 |
| COMPARATIVE EXAMPLE 1 | −2.9 | 2.4E+12 | 7600 | 2.5E+12 | 25000 | <0.5 |
| COMPARATIVE EXAMPLE 2 | −2.5 | 2.1E+12 | 7600 | 2.1E+12 | 25000 | 8.7 |

As is apparent from Table 2, the withstand voltage resulting from hole conduction is prominently low in Comparative Example 2. As is apparent from Table 3, the residual capacitance per unit area is prominently low in Comparative Example 2.

Here, Comparative Example 2 is compared against Implementation Example 3. Between Comparative Example 2 and Implementation Example 3, the flow rate of disilane, which is the impurity gas, is different. In other words, between Comparative Example 2 and Implementation Example 3, the ratio of the difference in flow rate between the Group 5 source gas and the Group 3 source gas to the flow rate of disilane is different. It is concluded that, when the difference in flow rate between the Group 5 source gas and the Group 3 source gas is not appropriately set relative to the flow rate of disilane, the residual p-type carrier concentration exceeds its appropriate value, as a result of which the residual capacitance increases and the withstand voltage resulting from hole conduction decreases.

While the ratio of the difference in flow rate between the Group 5 source gas and the Group 3 source gas to the flow rate of disilane is $8.44\times10^6$ in Implementation Example 3, the ratio of the difference in flow rate between the Group 5 source gas and the Group 3 source gas to the flow rate of disilane is $9.39\times10^6$ in Comparative Example 2. Accordingly, it is concluded that a compound semiconductor that has good buffer characteristics can be grown when the ratio of the difference in flow rate between the Group 5 source gas and the Group 3 source gas to the flow rate of disilane is approximately $9.0\times10^6$ or less. The ratio of the difference in flow rate between the Group 5 source gas and the Group 3 source gas to the flow rate of disilane can be $8.44\times10^6$ or less.

While the flow rate ratio of the Group 5 source gas to disilane is $8.73\times10^6$ in Implementation Example 3, the flow rate ratio of the Group 5 source gas to disilane is $9.71\times10^6$ in Comparative Example 2. Accordingly, it is concluded that, in a case where the flow rate ratio of the Group 5 source gas to the Group 3 source gas is 30, a compound semiconductor that has good buffer characteristics can be grown when the flow rate ratio of the Group 5 source gas to disilane is approximately $9.0\times10^6$ or less. When the flow rate ratio of the Group 5 source gas to the Group 3 source gas is 30, the flow rate ratio of the Group 5 source gas to disilane can be $8.73\times10^6$ or less.

While the product of the residual carrier concentration and the thickness is $7.0\times10^{11}$ in Implementation Example 3, the product of the residual carrier concentration and the thickness is $1.0\times10^{12}$ in Comparative Example 2. Accordingly, it is concluded that a compound semiconductor that has good buffer characteristics can be grown when the product of the residual carrier concentration and the thickness is $8.0\times10^{11}$ or less. The product of the residual carrier concentration and the thickness can be $7.0\times10^{11}$ or less.

As is apparent from the above, the compound semiconductor epitaxial wafers of Implementation Examples 1, 2, and 3 exhibit similar device characteristics to the compound semiconductor epitaxial wafer of Comparative Example 1 even though the Group 5 source gas is cut by approximately 60% when compared with the compound semiconductor epitaxial wafer of Comparative Example 1. Here, as is apparent from Comparative Example 2, sufficient characteristics can not be achieved simply by reducing the Group 5 source gas. Specifically speaking, use of the configurations relating to the present invention allowed for a Group 3-5 compound semiconductor that exhibits good device characteristics despite significant reduction in the amount of the Group 5 source gas used. Thus, the present invention can significantly reduce the cost of producing a compound semiconductor epitaxial wafer and a semiconductor device.

Although some aspects of the present invention have been described by way of exemplary embodiments, it should be understood that those skilled in the art might make many changes and substitutions without departing from the spirit and the scope of the present invention which is defined only by the appended claims.

The claims, specification and drawings describe the processes of an apparatus, a system, a program and a method by using the terms such as operations, procedures, steps and stages. When a reference is made to the execution order of the processes, wording such as "before" or "prior to" is not explicitly used. The processes may be performed in any order unless an output of a particular process is used by the following process. In the claims, specification and drawings, a flow of operations may be explained by using the terms such as "first" and "next" for the sake of convenience. This, however, does not necessarily indicate that the operations should be performed in the explained order.

What is claimed is:

1. A method of producing a semiconductor wafer, comprising:
   placing a base wafer within a reaction chamber; and
   epitaxially growing a buffer layer made of a p-type Group 3-5 compound semiconductor on the base wafer by supplying, into the reaction chamber, a Group 3 source gas consisting of an organometallic compound of a Group 3 element, a Group 5 source gas consisting of a compound of a Group 5 element, and an impurity gas including an impurity that is to be incorporated as a dopant into a semiconductor to serve as a donor, wherein
   during the epitaxial growth of the buffer layer, the flow rate of the impurity gas and the flow rate ratio of the Group 5 source gas to the Group 3 source gas are set so that the product N×d ($cm^{-2}$) of the residual carrier concentration N ($cm^{-3}$) and the thickness d (cm) of the buffer layer may be $8.0\times10^{11}$ or less.

2. The method as set forth in claim 1 of producing a semiconductor wafer, wherein
   during the epitaxial growth of the buffer layer, the flow rate ratio of the Group 5 source gas to the Group 3 source gas is set to 50 or less.

3. The method as set forth in claim 1 of producing a semiconductor wafer, wherein
   during the epitaxial growth of the buffer layer, the flow rate of the impurity gas and the flow rate ratio of the Group 5 source gas to the Group 3 source gas are set so that the residual capacitance per unit area determined by capacitance-voltage measurement using a Schottky electrode in contact with an active layer disposed on the buffer layer may become less than $0.5$ $nF/cm^2$.

4. The method as set forth in claim 1 of producing a semiconductor wafer, wherein
   during the epitaxial growth of the buffer layer on the base wafer, the ratio of the difference in flow rate between the Group 5 source gas and the Group 3 source gas to the flow rate of the impurity gas is set to $9.0\times10^6$ or less.

5. The method as set forth in claim 1 of producing a semiconductor wafer, wherein
   the impurity gas includes at least one element selected from the group consisting of Si, Se, Ge, Sn, S and Te.

6. The method as set forth in claim 1 of producing a semiconductor wafer, wherein the buffer layer and an active layer are stacked on the base wafer in the stated order.

7. A semiconductor wafer comprising:

a base wafer; and a buffer layer made of a p-type Group 3-5 compound semiconductor epitaxially grown on the base wafer by supplying a Group 3 source gas consisting of an organometallic compound of a Group 3 element, a Group 5 source gas consisting of a compound of a Group 5 element, and an impurity gas including an impurity that is to be incorporated as a dopant into a semiconductor to serve as a donor, wherein the buffer layer has a product of N×d ($cm^{-2}$) of its residual carrier concentration N ($cm^{-3}$) and its thickness d (cm) of $8.0 \times 10^{11}$ or less.

8. The semiconductor wafer as set forth in claim 7, wherein the buffer layer has been epitaxially grown under such a condition that the flow rate ratio of the Group 5 source gas to the Group 3 source gas becomes 50 or less.

9. The semiconductor wafer as set forth in claim 7, wherein the residual capacitance per unit area is less than 0.5 $nF/cm^2$ in capacitance-voltage measurement using a Schottky electrode in contact with an active layer disposed on the buffer layer.

10. The semiconductor wafer as set forth in claim 7, wherein the buffer layer has been epitaxially grown under such a condition that the ratio of the difference in flow rate between the Group 5 source gas and the Group 3 source gas to the flow rate of the impurity gas is $9.0 \times 10^6$ or less.

11. The semiconductor wafer as set forth in claim 7, wherein the semiconductor wafer includes at least one element selected from the group consisting of Si, Se, Ge, Sn, S and Te as a donor impurity.

12. The semiconductor wafer as set forth in claim 7, wherein the buffer layer and an active layer are stacked on the base wafer in the stated order.

* * * * *